United States Patent
Kato et al.

(10) Patent No.: US 7,008,754 B2
(45) Date of Patent: Mar. 7, 2006

(54) METHOD FOR FORMING IMAGE ON OBJECT SURFACE INCLUDING CIRCUIT SUBSTRATE

(75) Inventors: Masatoshi Kato, Osaka (JP); Akio Harada, Osaka (JP)

(73) Assignee: Daiken Chemical Co., Ltd., Osaka (JP)

( * ) Notice: Subject to any disclaimer, the term of this patent is extended or adjusted under 35 U.S.C. 154(b) by 0 days.

(21) Appl. No.: 10/489,389

(22) PCT Filed: Jul. 18, 2002

(86) PCT No.: PCT/JP02/07291

§ 371 (c)(1),
(2), (4) Date: Mar. 11, 2004

(87) PCT Pub. No.: WO03/026368

PCT Pub. Date: Mar. 27, 2003

(65) Prior Publication Data

US 2004/0241585 A1 Dec. 2, 2004

(30) Foreign Application Priority Data

Sep. 11, 2001 (JP) .............................. 2001-275061

(51) Int. Cl.
*G03F 7/00* (2006.01)

(52) U.S. Cl. ...................... 430/311; 430/198; 430/313; 430/330; 430/945

(58) Field of Classification Search ................ 430/311, 430/313, 330, 198, 945
See application file for complete search history.

(56) References Cited

U.S. PATENT DOCUMENTS 4,887,225 A * 12/1989 Yao ............................ 358/1.5

(Continued)

FOREIGN PATENT DOCUMENTS

EP        0 814 382        12/1997

(Continued)

OTHER PUBLICATIONS

English abstract of JP 59-114856 from JPO "Formation of Thick FIlm CIrcuit Pattern", Hisako et al., Jul. 1984.*

(Continued)

*Primary Examiner*—Nicole Barreca
(74) *Attorney, Agent, or Firm*—Koda & Androlia

(57) ABSTRACT

By using a novel method, the exposure time of the photosensitive paste layer is reduced and the exposure fineness of the layer is improved, thereby developing a highly fine circuit substrate of high density having a thermal resistance at a reasonable cost. A circuit substrate is manufactured as follows. A photosensitive paste containing photoresist and a circuit material is applied onto a substrate surface so as to form a photosensitive paste layer (4). This photosensitive paste layer (4) is plotted by a laser beam (8) so as to form a plotted area (7). The photosensitive paste layer (4) is developed and an exposed area (4a) or an unexposed area (4b) is removed so as to form a circuit pattern (17). This circuit pattern (17) is sintered to form a circuit pattern (20) composed of the circuit material. It is possible to form a highly fine circuit pattern of high density by laser beam plotting. Moreover, when a greensheet (2) is used as the substrate, it is possible to form a ceramic substrate (18) having a thermal resistance by sintering. Furthermore, by using this method, it is possible to form an arbitrary image on an arbitrary object.

4 Claims, 10 Drawing Sheets

U.S. PATENT DOCUMENTS 5,676,781 A * 10/1997 Aoki et al. ............... 156/89.12
6,156,237 A * 12/2000 Kubota et al. .............. 252/512

FOREIGN PATENT DOCUMENTS

| JP | 59-114856 | 7/1984 |
| JP | 5-273761 | 10/1993 |
| JP | 7-135386 | 5/1995 |

OTHER PUBLICATIONS

PTO: 2005-2982, English translation of JP 59-114856, "Method for Formation of Thick Film Circuit Pattern", Hisako et al., Jul. 1984.*

* cited by examiner (A)

(B)

(C)

(D)

(E)

METHOD FOR FORMING IMAGE ON OBJECT SURFACE INCLUDING CIRCUIT SUBSTRATE

TECHNICAL FIELD

The present invention relates to a method for forming image on an object surface including circuit substrate, and more specifically relates to the method for forming image on the object surface comprised by the steps of scanning a laser beam to irradiate for a photosensitive paste layer which consists of a mixture of colorant materials and photoresist, forming a plotting area consisted of highly fine image patterns, and developing the photosensitive paste layer to form the highly fine image pattern.

BACKGROUND ART

As the object having image pattern, there are circuit substrate, mug, craftwork and so on. The circuit substrate is an object which is formed a circuit pattern on a surface thereof the mug is an object having a decoration image on outer circumferential surface of the cup which is made from ceramics, and many of craftworks are the objects formed an industrial art decoration image on the surface of industrial art articles. Since highly fine and densification of the circuit pattern (image pattern) are required especially, for the circuit substrate in these objects, the conventional circuit substrate is described below as a typical example.

In recent years, progress of information and communication technology and progress of electronic devices promote miniaturization and densification of circuit substrate, and there appears the high density multilayer circuit substrate completed by fusing thin and thick film techniques into multilayered technique. In addition, in fields of run vehicle, jet plane and rocket etc., it is pushed forward hurriedly the development of an electric device which can endure high temperature, high humidity, vibration and mine dust generated by engine system, road surface friction, and air friction etc.

In order to introduce heat resistance, damp-proof, vibration-proof and dustproof as well as miniaturization and densification electronic devices, it is requested that the circuit substrate possesses such properties. The circuit substrate is the material which is formed by the circuit pattern on the surface thereof, and in particular, a ceramics substrate is used as substrate which satisfies heat resistance and high temperature resistance.

FIG. 10 shows a manufacturing process diagram of conventional circuit substrate which is made from a ceramics substrate. In the process of (A), greensheet 2 formed by ceramic materials is arranged at the predetermined location. This greensheet is a raw material of sheet-shape formed from slurry, which is made from mixture of ceramic powder, organic solvent, organic binder and plasticizer.

In the process of (B), unexposed substrate 3 is formed by applying photosensitive paste layer 4 on the greensheet 2. At first, photosensitive paste is prepared by mixing, for example, circuit material Ag and photoresist of photosensitive agent, and then photosensitive paste layer 4 is formed by applying said photosensitive paste to the surface of the greensheet 2.

In the process of (C), a latent image of circuit pattern is formed by irradiating ultraviolet rays on photosensitive paste layer 4. Conventionally, photomask 60 is used to form the latent image. In the photomask 60, there are light-passing area 60a shown by white background and non-light-passing area 60b on shown by hatching.

The photomask 60 is opposed to the photosensitive paste layer 4, and ultraviolet radiation 62 is irradiated on the whole surface. The ultraviolet radiation 62 is intercepted in non-light-passing area 60b, and transmits only in light-passing area 60a. Therefore, in the photosensitive paste layer 4, there are formed exposed area 4a which received the ultraviolet irradiation, and unexposed area 4b which did not receive ultraviolet irradiation. In other words, the opposed area of light-passing area 60a becomes exposed area 4a, and the opposed area of non-light-passing area 60b becomes unexposed area 4b.

In the process of (D), whole surface of photosensitive paste layer 4 is developed by spraying of developing solution 14 from developing device 12 or by dipping into developing solution. Unexposed area 4b becomes removal area 16 by removing photosensitive paste, because the latent image is not formed. On the other hand, as for exposure part 4a in which the latent image is formed, the photoresist is harden by polymerizing through developing and remains just. Therefore, unsintered circuit pattern 17 is formed on the surface of the greensheet 2.

In the process of (E), the greensheet having unsintered circuit pattern 17 is sintered at desired temperature. All the organic matter of greensheet 2 is burnt and removed by sintering, and then the remained ceramic materials are sintered to be ceramic substrate 18. At the same time, all the organic matter of unsintered circuit pattern 17 is burnt and removed, too, and the remained Ag powder becomes the uniform Ag film to form the circuit pattern 20.

In this way, circuit substrate 22 which consists of ceramics substrate 18 with circuit pattern 20 is completed. For the circuit substrate 22, it is clear that a high density circuit pattern can be provided because circuit pattern 20 is formed with photomask 60, and besides, the high temperature resistance characteristic is realized because ceramic substrate 18 is used.

This circuit substrate is excellent at a point to possess both of densification and high temperature resistance characteristic by using thin and thick film techniques and ceramic sintering technique. In addition, this circuit substrate is excellent at the point of vibration-proof and dust-proof, because a conductor circuit is integrated inside of ceramics. However, the weakest point of this circuit substrate is that the photomask is used for exposure.

The first weak point of photomask utilization is that the great cost and time are required to form the photomask. It says generally, a lot of processes are needed for production of photomask.

The photomask production begins from a pattern layout diagram appeared on the basis of a circuit design drawing. Based on the design data, a master reticle of size of 10 times is made by pattern generator. Next, the master reticle is reduced to the 1/10 size by a photo repeater, and a master mask is made by duplicate of the reduced one. A work mask which is used for actual processing is made from said master mask. Therefore, time and cost are necessary by all means, because a few days are needed to make a piece of work mask.

The second weak point of photomask utilization is that there is a limitation in precision of the pattern. An innovation is needed for making of more precise photomask, because the limit precision size of a photomask is about 1 $\mu$m.

The third weak point of photomask utilization is that the latent image cannot be formed according to the fineness of dimension of a photomask because the ultraviolet radiation is diffracted through the photomask. It is better that photomask is adhered to the photosensitive paste layer to make better exposure fineness, but the surface of the photosensitive paste layer might be injured. In other words, the contact of the photomask is denied absolutely, because the photosensitive paste surface is damaged if the photomasks come in contact with undried photosensitive paste layer. On the other hand, in the case of drying of the photosensitive paste, the production cost rises because the manufacturing process becomes complicated by a requirement of time for drying.

In there, as shown in FIG. 10(C), it is usual that photomask 60 is arranged to be estranged with only minute distance from photosensitive paste layer 4. Then, the width of unexposed section 4b becomes smaller or larger than the width of non-light-passing area 60b, because ultraviolet radiation diffracts at both end edges of non-light-passing area 60b. This means that exposure fineness of photosensitive paste layer 4 gets worse than the pattern precision of the photomask 60.

Although the weak points of conventional circuit substrate production method are described above, there are also the similar weak points in the case that the image pattern is formed on the general object surface. That is to say, an image pattern can be formed through the steps of forming photosensitive paste by mixing photoresist and colorant powder, applying the photosensitive paste to the object surface uniformly, irradiating ultraviolet to the surface through a photomask and developing. However, so far as a photomask is employed, said same weak point as the circuit substrate cannot be avoided in the case of this image pattern forming, too.

Therefore, the present invention of method for forming image on object surface including circuit substrate aims at forming of an image with high fineness and high density on a object surface by using of novel exposure method without the photomask, so that reducing of the time and cost to make photomask, shortening of exposure time of photosensitive paste layer and improving of the exposure precision are realized.

DISCLOSURE OF INVENTION

The present invention is achieved to solve the problem as described above. First form of the present invention is a method for manufacturing a circuit substrate comprising the steps of: mixing a photoresist and a circuit material to form a photosensitive paste, applying said photosensitive paste to a surface of a substrate to form a photosensitive paste layer, plotting said photosensitive paste layer by a laser beam to form a plotted area consisting of exposed and unexposed areas, developing said photosensitive paste layer to form an unsintered circuit pattern by removing said exposed area or said unexposed area, and sintering said unsintered circuit pattern to form a circuit pattern composed of said circuit material.

Second form of the present invention is the method according to said first form, wherein said substrate is made from a sheet-shaped greensheet which consists of a mixture of a ceramic powder and an organic binder, and said greensheet is sintered simultaneously with said unsintered circuit pattern to form a ceramic substrate.

Third form of the present invention is a method for manufacturing multilayer circuit substrate comprises the steps of: mixing a photoresist and a circuit material to form a photosensitive paste, applying said photosensitive paste to a surface of a substrate to form a photosensitive paste layer, plotting said photosensitive paste by a laser beam to form a plotted area consisting of exposed and unexposed areas, developing said photosensitive paste layer to form an unsintered circuit pattern by removing said exposed area or said unexposed area, piling up a plurality of substrates formed said unsintered circuit pattern to form an unsintered multilayer circuit substrate, and sintering said unsintered multilayer circuit patterns through sintering said unsintered multilayer circuit substrate to form a circuit pattern composed of said circuit material.

Fourth form of the present invention is a method according to said third form, wherein said substrate is made from a sheet-shaped greensheet which consists of a mixture of a ceramic powder and an organic binder, and said greensheets are sintered simultaneously with said unsintered multilayer circuit substrate to form ceramic substrates.

Fifth form of the present invention is the method according to said third form, wherein one or more base holes are formed on said greensheet, said plotted area is formed on said photosensitive paste layer with a predetermined location for said hole, and said unsintered multilayer circuit substrate is formed by piling up a plurality of greensheets in a state that all base holes are adjusted in a line up and down.

Sixth form of the present invention is the method according to any of said first to fifth forms, wherein circuit pattern data are stored in a computer, said laser beam is converted to an on-off laser beam corresponding to said circuit pattern by computer signals based on said circuit pattern data, and said plotted area consisting of exposed and unexposed areas is formed on said photosensitive paste layer by irradiating said on-off laser beam on a surface of said photosensitive paste layer with scanning.

Seventh form of the present invention is the method according to said sixth form, wherein said circuit pattern data are input into a waveform shaping unit as said computer signals, said laser beam emitted from a laser source is entered into said waveform shaping unit, and said laser beam is converted to said on-off beam corresponding to said circuit pattern by said computer signals.

Eighth form of the present invention is a method for forming an image on an object surface comprising the steps of: mixing a photoresist and a colorant to form an photosensitive paste, applying said photosensitive paste to a surface of an object to form a photosensitive paste layer, plotting said photosensitive paste layer by a laser beam to form a plotted area consisting of exposed and unexposed areas, and developing said photosensitive paste layer to form an unsintered image pattern by removing said exposed area or said unexposed area.

Ninth form of the present invention is the method according to said eighth form, wherein said unsintered image pattern is formed on each plane in a case that said object is an plane shaped object or a polyhedron.

Tenth form of the present invention is the method according to said eighth form, wherein said unsintered image pattern is formed on each curved surface in a case that said object is a curved surface body consisting of one or more curved surfaces.

Eleventh form of the present invention is the method according to said eighth form, wherein an image pattern is formed on said object surface by sintering said unsintered image pattern.

Twelfth form of the present invention is the method according to said eighth form, wherein circuit pattern data are stored in a computer, said laser beam is converted to an on-off beam corresponding to said image pattern by computer signals based on said image pattern data, and said plotted area consisting of exposed and unexposed areas is formed on said photosensitive paste layer by irradiating said on-off laser beam on a surface of said photosensitive paste layer.

BEST MODE FOR CARRYING OUT THE INVENTION

In the following, the embodiments of production method of circuit substrate according to the present invention are explained in details with reference to the attached diagrams.

Figure 1:
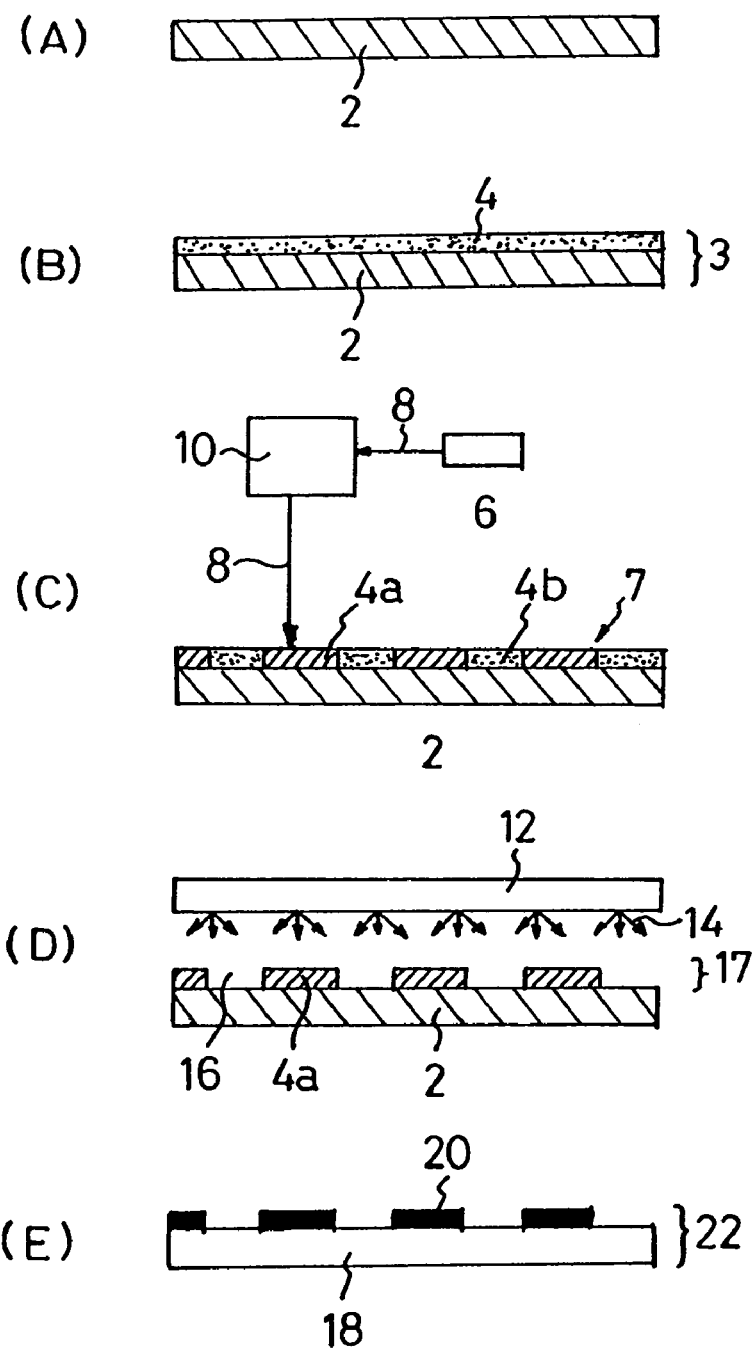
FIG. 1 is a manufacturing process diagram of one layer circuit substrate which is the first embodiment of the present invention.

FIG. 1 is a manufacturing process diagram of one layer circuit substrate of the first embodiment of the present invention. In the process of (A), the greensheet 2 which becomes a board of circuit substrate is arranged in a predetermined location. First, ceramic powder which becomes a base agent of greensheet 2 is prepared. Various materials are employed as the ceramic powder. For example, the mixture of borosilicate glass powder consisting of $CaO.Al_2O_3.B_2O_3.SiO_2$ system and alumina powder with a weight ratio of 60:40 may be used.

A slurry is prepared by mixing the ceramics powder, organic solvent, organic binder and plasticizer, and the slurry is formed to a sheet of 1 to 300 $\mu$m in thickness by doctor blade method, and then a raw greentape is made by winding the sheet. The greensheet 2 is formed by cutting the greentape with a predetermined length.

In the process of (B), photosensitive paste layer 4 made by applying photosensitive paste to the surface of the greensheet 2 and then the unexposed substrate 3 is formed. Said photosensitive paste is the paste consisting of the mixture of circuit material and photoresist.

There are negative type and positive type in photoresist. The negative type photoresist is a material of the form that an exposed area remains by developing, and the positive type photoresist is a material of the form that an exposed area is removed by developing. Both types can be used to the present invention, and an example of negative type photoresist is shown in FIG. 1.

A mixed organic paste consisting of photocoagulation resin, low viscous monomer and photopolymerization initiator can be used as a photoresist. Of course, photoresist aside from this composition can be used, too. For example, as the photocoagulation resin, there are unsaturated polyester system, acrylate system, and methacrylate system. This resin has an alkali-solubility in unhardening state, and has an property that photopolymerization part becomes to be insolubilization. In addition, well-known photosensitive binder resin can be used.

As low viscous monomer, there are polyester acrylate, epoxy acrylate, urethane acrylate and etc. As photopolymerization initiator, there are benzophenone system, benzoin system, acetophenone system and thioxanthone system, and also other well-known photopolymerization initiator can be used.

As the circuit materials mixed with photoresist, there are chosen the materials adapted to objective circuit pattern. For example, metal powder forming an electrode pattern, dielectric powder forming a dielectric pattern and resistor powder forming a resistor pattern are chosen as circuit materials.

For the metal powder, electrode metal powder of Au, Ag, Pt, Ni, Al, Pd, Ni etc. and their mixture are used. As the dielectric powder, high dielectric constant ceramic material powder such as barium titanate, strontium titanate and other well-known dielectric materials are chosen.

Well-known glass powder can be added in said dielectric materials. As the glass powder, there are available the glass materials such as $B_2O_3.Bi_2O_3$ system, $PbO.B_2O_3$ system, $PbO.SiO_2$ system, $PbO.B_2O_3.SiO_2$ system, $CaO.B_2O_3$ system, $CaO.PbO.SiO_2$ system, $MgO.B_2O_3$ system, $MgO.B_2O_3.SiO_2$ system, and their mixture of two or more kinds.

In addition, for resistor materials, the materials having arbitrary resistivity are made by the mixing of high resistivity metallic material powder and a low resistivity metallic material powder. There are Al, Ag and Cu etc. as the low resistivity metallic material, and there are Cr, AgPd, W, Ni, NiCr, Pd, Mo, CuZn, CuMn and $RuO_2$ etc. as the high resistivity metallic material.

Necessary quantity of organic solvent available for photopolymerization initiator and viscous adjustment can be added to said photo sensitive paste. There are acetophenone, thioxanthone, benzyl, benzyl ketal, benzoin, benzoin ether and benzophenone as photopolymerization initiator. In addition, terpineol, dihydroterpineol, ethyl carbitol, butyl carbitol, ethyl cellosolve, butyl cellosolve, and also ketones, ester, alcohol and aromatic series are used as organic solvent.

In the process of (C), a circuit pattern is plotted on the photosensitive paste layer 4 with laser beam 8. The details of this exposure process is described later, but describing easily, the laser beam 8 emitted from laser light source 6 is incident on laser plotting device 10, which scans laser beam 8 to draw arbitrary circuit pattern on the photosensitive paste layer 4 and then plotting area 7 is formed. The plotting area 7 is composed of exposed part 4a where laser beam 8 is irradiated and unexposed area 4b where said laser beam is not irradiated.

In the device of this diagram, it is adopted a method to convert the continuously emitted laser beam 8 to the on-off beam by laser plotting device 10. However, the on-off beam can be emitted directly from the laser light source 6 by a control circuit not illustrated, or it can be also available that the laser light source 6 is vibration pulse laser source itself.

In the process of (D), developing process is performed by the developing device 12 to spray the developing solution 14 for the photosensitive paste layer 4. Of course, dipping in developing solution is also available. The unexposed area 4b is removed, because the photoresist employed in this embodiment is a negative type. Therefore, unexposed area 4b is removed and becomes removal area 16, and then unsintered circuit pattern 17 is formed by remaining only exposed area.

In this stage, photoresist is polymerized and stiffened in exposed area 4a in which said circuit materials dispersed. In other words, said circuit materials are a incorporated in organic component. In addition, as for greensheet 2, ceramic powder is configured dispersedly in the organic component.

In the process of (E), the greensheet is sintered so that the organic components existing in exposed area 4a and the greensheet are burnt completely to be removed. Sintering temperature is adjusted freely in a range of temperature that organic component can be removed and also other remaining component can be sintered. Usually, the sintering temperature is 250 to 1500° C. and preferably 800 to 1500° C. The temperature is arranged depending on subject materials appropriately.

Therefore, the ceramic substrate 18 is formed by sintering the ceramic materials of greensheet 2, and the substrate can possess excellent heat resistance even if it is used in a high temperature region. In addition, minute circuit pattern 20 is formed by sintering circuit materials of exposed area 4a.

Said circuit pattern described above becomes electrode pattern, dielectric pattern, and resistor pattern depending on the circuit materials and also composite pattern made by combination of their patterns. Objective circuit pattern 20 can be formed freely, because the circuit characteristics of the circuit pattern 20 can be changed depending on the kinds of circuit materials.

As an example of composite pattern, first unsintered layer pattern 17 which becomes electrode pattern is formed and second unsintered layer pattern 17 which becomes dielectric pattern is formed on the first layer. After the greensheets 2 were sintered, the electrode pattern which becomes cable on the first layer is completed and the dielectric pattern is formed between the electrodes on the second layer, in short, a capacitor pattern is formed by sintering said greensheet 2. As described, according to the present invention, arbitrary objective circuit pattern 20 can be formed on the ceramics substrate 18.

Figure 2:
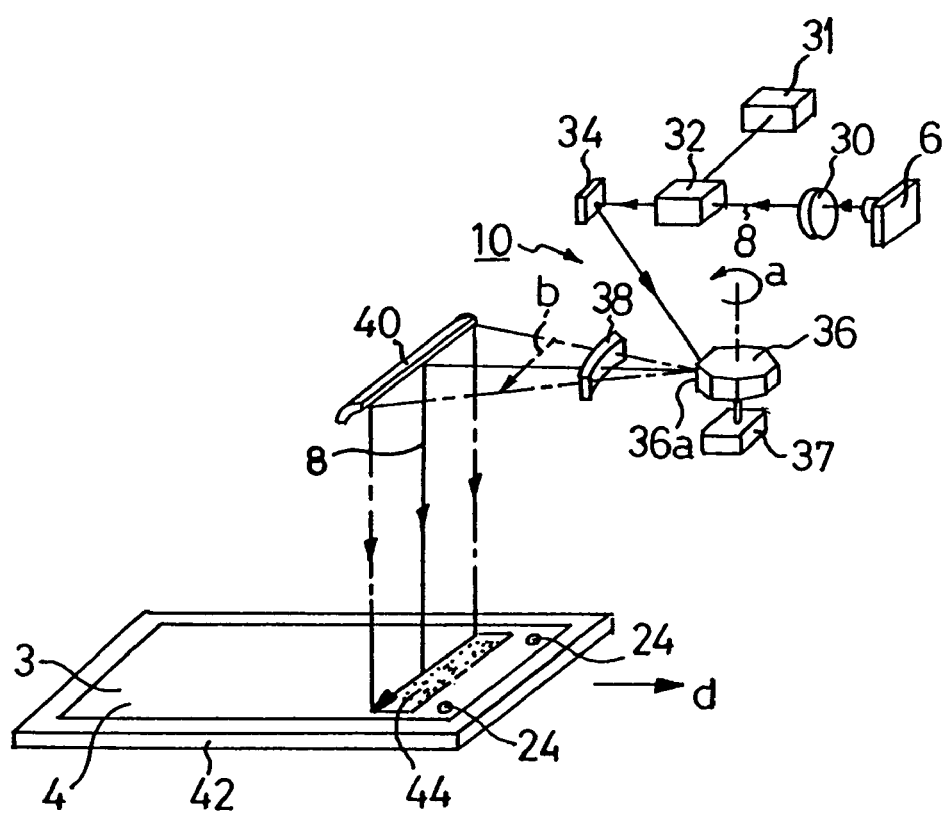
FIG. 2 is a detailed perspective diagram of exposure process shown in FIG. 1.

FIG. 2 is detailed perspective diagram of exposure process shown in FIG. 1. The unexposed substrate 3 is placed on the predetermined position of exposure base 42 and its photosensitive paste layer 4 is directed upwardly. Laser plotting device 10 is disposed at upward position of said exposure base 42. The exposure base 42 moves in arrowed direction d at constant velocity.

Said laser beam 8 emitted from said laser light source 6 such as semiconductor is converged by the collimator lens 30, and focused to thin laser beam of which cross sectional diameter is up to 1 μm. The cross sectional diameter gives the exposure precision, and the exposure treatment can be realized with higher fineness than exposure by utilization of a photomask.

And then, the laser beam 8 is injected into the waveform shaping unit 32, and the on-off control of beam is done by means of computer signal from the computer 31. The circuit pattern data which should be formed on the plotting area 44 of photosensitive paste layer 4 are stored as binary data composed of on-off in the computer 31.

Computer signals of the binary on-off data are transmitted to the waveform shaping unit 32. The laser beam 8 passes at a time of computer signal on, and intercepted at a time of the signal off. Said on is an exposure signal and said off is an unexposure signal. Needless to say, this signal aspect reverses by means of a photoresist type of positive or negative.

The laser beam 8 converted to said on-off signal reaches to the reflection plane 36a of polygon mirror 36 by reflection at the mirror 34. A surface of the polygon mirror 36 consists of many reflection plane of 36a, 36a and so on, and it is rotated by the motor 37 in the direction of the arrow a.

The reflected laser beam 8 deviates to the direction of the arrow b according to the rotation of said reflection plane 36 and returns to the starting position by the next reflection plane of 36a, and deviates again. The laser beam 8 moves overall width of exposure mirror 40 through the fθ lens 38 at a time. The laser beam 8 reflected downward moves overall width of plotting area 44.

The photosensitive paste layer is exposed by an emitted laser beam at the time of on, and unexposed at the time of off because the laser beam is intercepted. Said exposure and unexposure form dot pattern and then unsintered circuit pattern is formed on the plotting area 44. The minute circuit pattern is formed by the laser beam scan, because the smaller cross sectional diameter of the laser beam 8 becomes, the smaller the diameter of the dots becomes.

With the present invention, it is available that the greensheet is exposed with high speed and highly fineness, because laser beam 8 is used as exposure means. If the circuit pattern changes, circuit pattern data which is stored in computer 31 may be changed, and arbitrary circuit pattern can be formed by computer techniques with reasonable cost.

Figure 3:
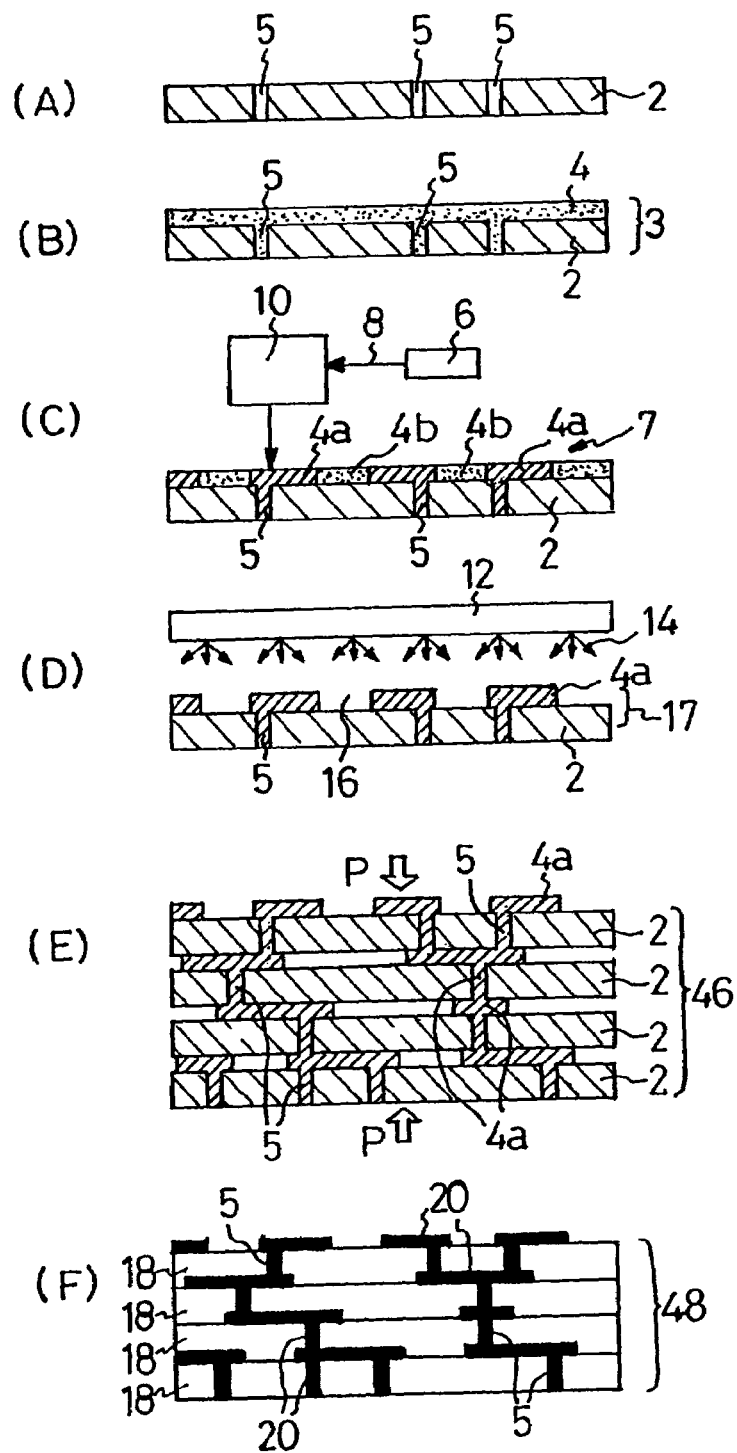
FIG. 3 is a manufacturing process diagram of multilayered circuit substrate which is the second embodiment of the present invention.

FIG. 3 is the manufacturing process diagram of multilayer circuit substrate in second embodiment of the present invention. In this embodiment, a plurality of greensheet 2 formed unsintered circuit pattern are laminated, and then the multilayer circuit substrate is formed by sintering it. Codes repeated in FIG. 1 represent the same members.

In the process of (A), greensheet 2 having through hole 5 is arranged in an predetermined position. In the process of (B), photosensitive paste is made from mixture of photoresist and circuit materials, and the paste is applied to the surface of the greensheet 2 to form the photosensitive paste layer 4. The photosensitive paste is also filled in the through hole 5.

In the process of (C), said laser beam 8 is emitted from the laser light source 6, and the laser beam 8 is converted to dot pattern (on-off pattern) with the laser plotting device 10 and said beam scans under control of the device to form an arbitrary circuit pattern on the surface of the photosensitive paste layer 4b.

The area scanned by the laser beam 8 on the photosensitive paste layer 4 becomes plotting area 7 which consists of exposed area 4a and unexposed area 4b. In this embodiment, the exposed area 4a remains and becomes thye circuit pattern, and needless to say, the circuit pattern may be formed by remaining of unexposed area 4b, when suitable photoresist is selected.

In the process of (D), the photosensitive paste layer 4 is developed by spray of the developing solution 14 with the developing device 12. As a result, unexposed area 4b which does not contain a latent image is removed, and exposed area 4a is remained and hardened by development. The pattern of the exposed area 4a becomes unsintered circuit pattern 17. The hole is incorporated in the unsintered circuit pattern 17 as the exposed area 4a and remained, because inside of the through hole 5 is exposed.

In this way, some of greensheet 2 with unsintered circuit pattern 17 are formed. In the process of (E), a plurality of greensheet are piled, and heated from top and bottom with pressure (thermo compression bonding) to unify them, and unnecessary gap is disappeared to form unsintered multilayer circuit substrate 46. The upper and lower unsintered circuit pattern 17, 17 are piled and connected according to design through the through hole 5.

In the process of (F), unsintered multilayer circuit substrate 46 is sintered in heating furnace which is not illustrated. The sintering temperature is arranged as same as the case of FIG. 1. Organic matter is removed from said greensheet 2, 2 ..., and ceramic materials become ceramic substrate 18, 18 ..., through the sintering process. In addition, organic matter is removed form exposed area 4a, and said circuit materials are sintered to be the thin uniform circuit pattern 20.

In the case that said circuit materials are electroconductivity metal, the upper and the lower circuit pattern are electrically connected because a metal film is formed in the inside of the through hole 5. In this way, the unsintered multilayer circuit substrate 46 becomes multilayer circuit substrate 48 by sintering, and then the circuit substrate designed to be small type and high density is finished.

A characteristic of this circuit substrate is that the circuit pattern with extreme fineness can be formed and high density circuit is formed in small area, because the circuit pattern is formed by laser beam. Besides, it can contribute to miniaturization and densification required for recent electric circuit because it is more densified by multilayerization.

In addition, the circuit substrate can endure high temperature because ceramics substrate is made by sintered greensheet as a board having circuit pattern, in this embodiment. In addition, the circuit substrate has the characteristics of damp-proof, vibraition-proof and dust-proof because of the integration of circuit and ceramic. For example, the circuit substrate can be used in the situation that object surface becomes high temperature like automobile engine, aircraft engine and other engine etc, or is exposed with bad environment (humidity, dirt, vibration).

In the present invention, not only the greensheet is used as a substrate but also a heat-resistant substrate can be used instead of the greensheet. Then, said substrate does not change in the case that the unsintered circuit pattern is sintered to form the circuit pattern. The heat-resistant substrate does not receive heat denaturation in the case that the sintering temperature is lower than the heat-resistant temperature of the substrate.

In the case that the greensheet and the unsintered circuit pattern are sintered simultaneously, the ceramics materials and a circuit materials might diff-use into partner materials mutually, depending on the materials. In such case, if a heat-resistant substrate is used instead of the greensheet, the circuit substrate of excellent quality can be presented, because mutual diffusion is prevented.

Figure 4:
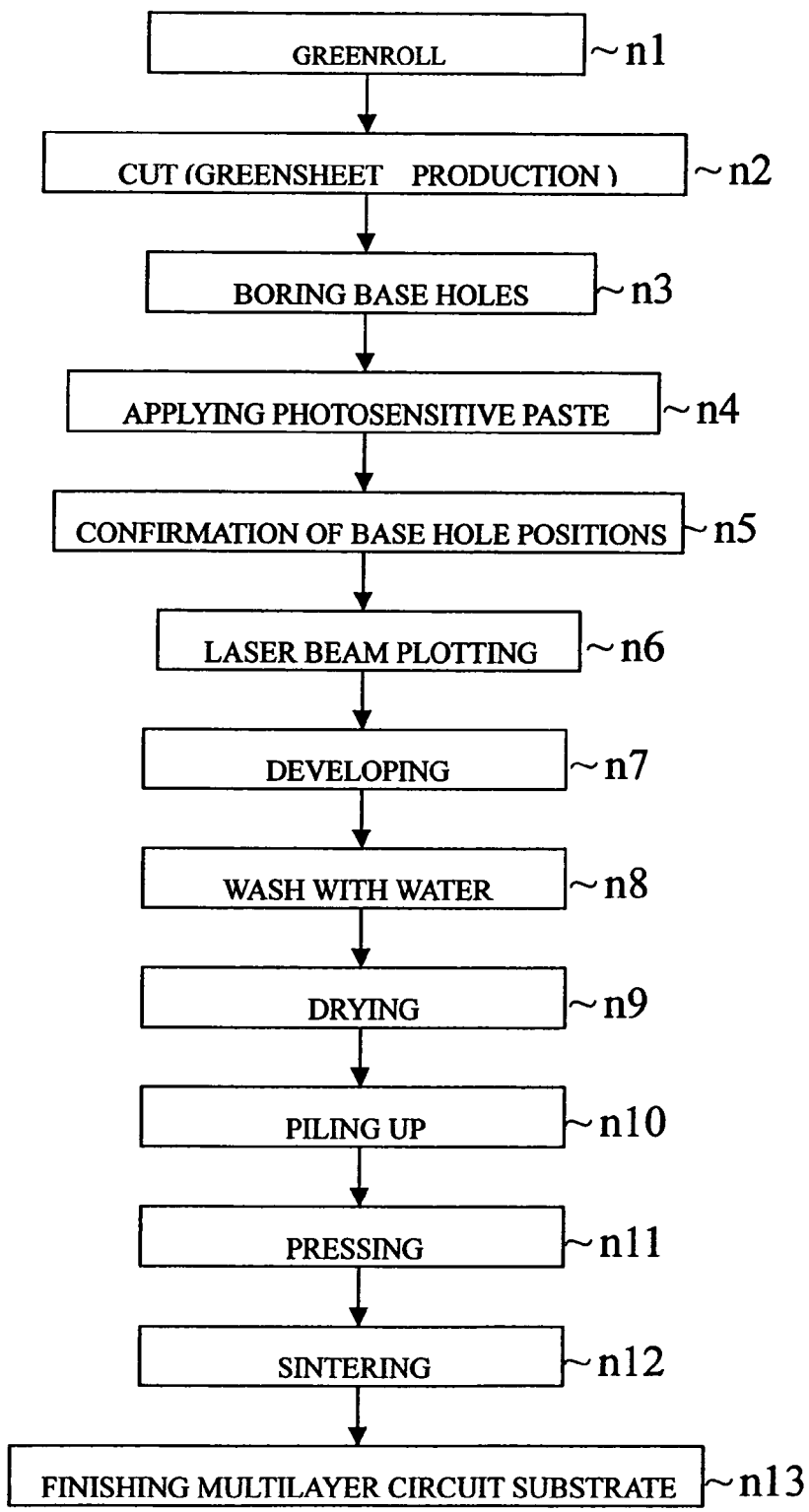
FIG. 4 is a detailed process diagram of multilayered circuit substrate shown in FIG. 3.

FIG. 4 is a detailed process diagram of multilayer circuit substrate shown in FIG. 3. At first, a greenroll which is wound with greentape in n1 is formed, and in n2, green tape is cut in a predetermined length with cutter, and then greensheet of uniformity length is formed. In n3, base holes are bored at predetermined positions while advancing the edge of the greensheet.

In n4, photosensitive paste is applied to the surface of the greensheet by doctor blade method, roll coat method or screen printing. The photosensitive paste may be dried or may not be dried. In n5, the base hole acts to fix the starting position of the laser beam, and circuit pattern is plotted by laser beam in n6. Said laser plotting is available even if the photosensitive paste is not dried. Conventionally, photosensitive paste must be dried in the case because the photomask comes in contact with photosensitive paste side, and according to the present invention, there is an advantage that the laser plotting is available promptly even if the photosensitive paste is not dried because of non-contact condition, so that drying process can be omitted. Needless to say, laser plotting may be performed on dried photosensitive paste.

In n7, the exposed photosensitive paste layer is developed, and after washed with water in n8, and it is dried out in n9. At this stage, unexposed area is removed, and unsintered circuit pattern which consists of only exposed area is formed.

In n10, unsintered multilayer circuit substrate is formed with a required number of piled greensheets having unsintered circuit pattern, and in n11, the greensheets are integrated by heat pressing from top and bottom to remove unnecessary gap. In n12, the greensheet becomes ceramics substrate and unsintered circuit pattern also becomes circuit pattern by sintering. In this way, multilayer circuit substrate is finished in n13.

Figure 5:
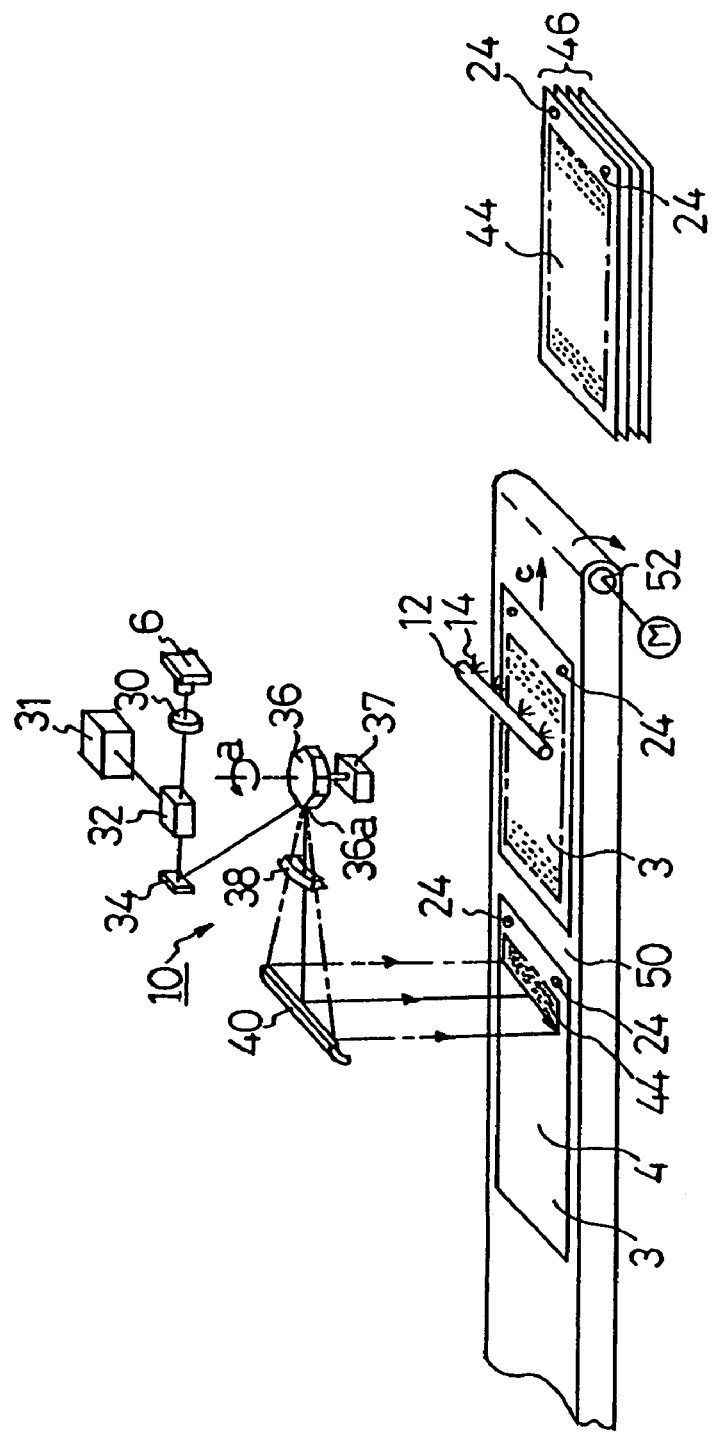
FIG. 5 is a detailed perspective diagram of exposure process shown in FIG. 3.

FIG. 5 is a detailed perspective diagram of exposure process shown in FIG. 3. The belt conveyor 50 is moved at constant speed to the direction of the arrow c by drive roller 52 which is driven rotationally by motor M. Plural unexposed substrates 3 are put on said belt conveyor 50 at predetermined interval, and they are moved in the direction of arrow c by the belt conveyor 50.

Since the laser light source 6 and the constitution and operation of laser plotting device 10 are illustrated in FIG. 2, the descriptions about them are omitted here. When the base hole 24 of unexposed substrate 3 is detected, the laser beam 8 scans from predetermined position, and the circuit pattern is plotted on the photosensitive paste layer 4 as dot patterns, so that plotting area 44 is formed.

When the plotting is finished, photosensitive paste layer 4 is developed by the developing device 12, which sprays developing solution to the photosensitive paste layer 4. A dipping method can be available for developing instead of said spray. The unexposed area 4b is removed by developing, and the circuit pattern which consists of exposed area 4a is formed.

The required number of substrates having circuit pattern on the plotting area 44 are piled to form the unsintered multilayer circuit substrate 46. In said process of piling, a position of piling of the multilayer circuit substrate completes automatically, if a base hole of each substrate is set to agree up and down mutually. The unsintered multilayer circuit substrate 46 is sintered to finish the multilayer circuit substrate.

Figure 6:
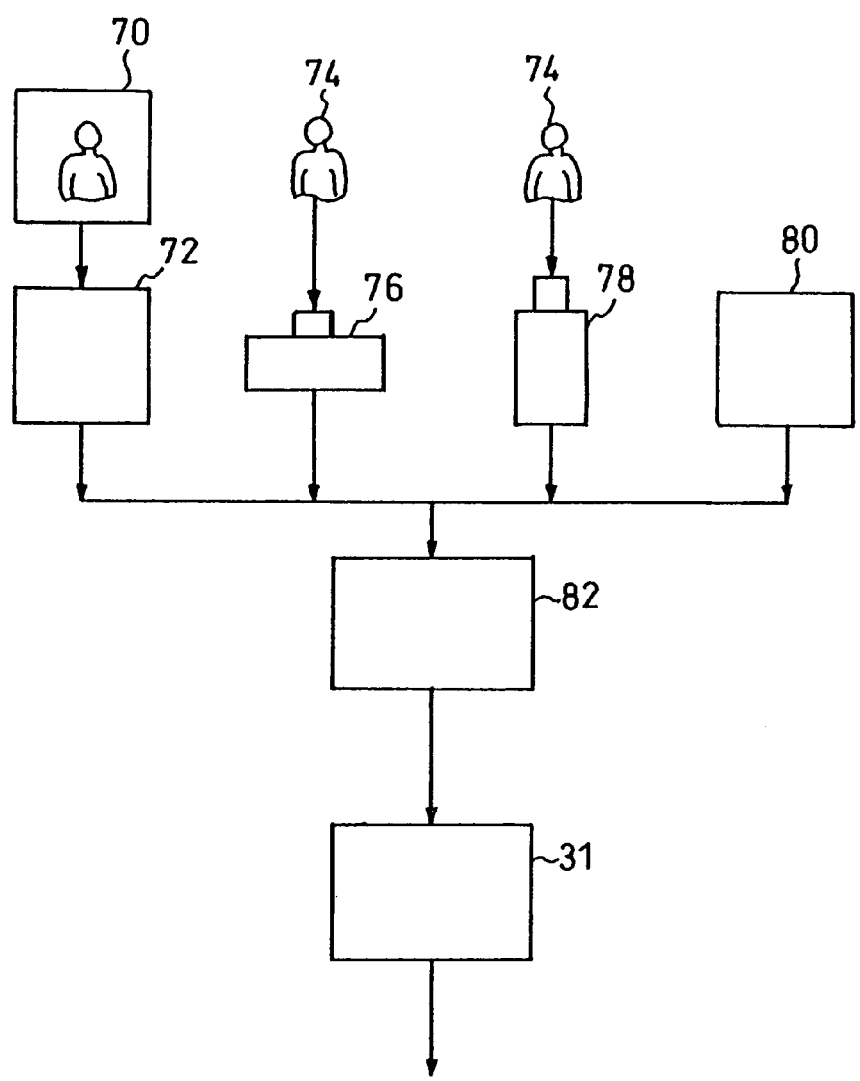
FIG. 6 is a treatment flow diagram in the case of forming of an image on an object aside from circuit substrate by applying of the present invention.

FIG. 6 is a treatment flow diagram in the case of forming of an image on any object aside from circuit substrate by applying of the present invention. The present invention is not only limited to the circuit substrate production method, but also provides an plotting method to form an arbitrary and fine image on a surface of various kind of object to be formed an image. Any object which is going to be formed an image on the surface is available, for example, china such as mug and etc., plastic products, ceramic products, metal products and so on, and also a solid product is included as well as a plane product. In addition, any images such as photograph or any kinds of picture are included as said picture formed on the surface. There are some kinds of method to scan these images.

Image documents 70 such as photograph or printed matter are converted to image pattern data with scanner 72, and the image pattern data are saved to the image storage facility 82. In addition, photogenic subject 74 such as person, background, document or figure is photographed with digital camera 76 and the photographed data are converted to image pattern data, and the digitized image pattern data are saved to the image storage facility 82.

Furthermore, it is available that said photogenic subject 74 is converted to image pattern data by digital video camera 78, and the image pattern data can be saved to the image storage facility 82. In addition, the digital image data 80 which are formed by other digital devices or software is saved to the image storage facility 82. The image pattern data saved in the image storage facility 82 can be read out to the laser plotting device 10 as computer signal through the computer 31.

Figure 7:
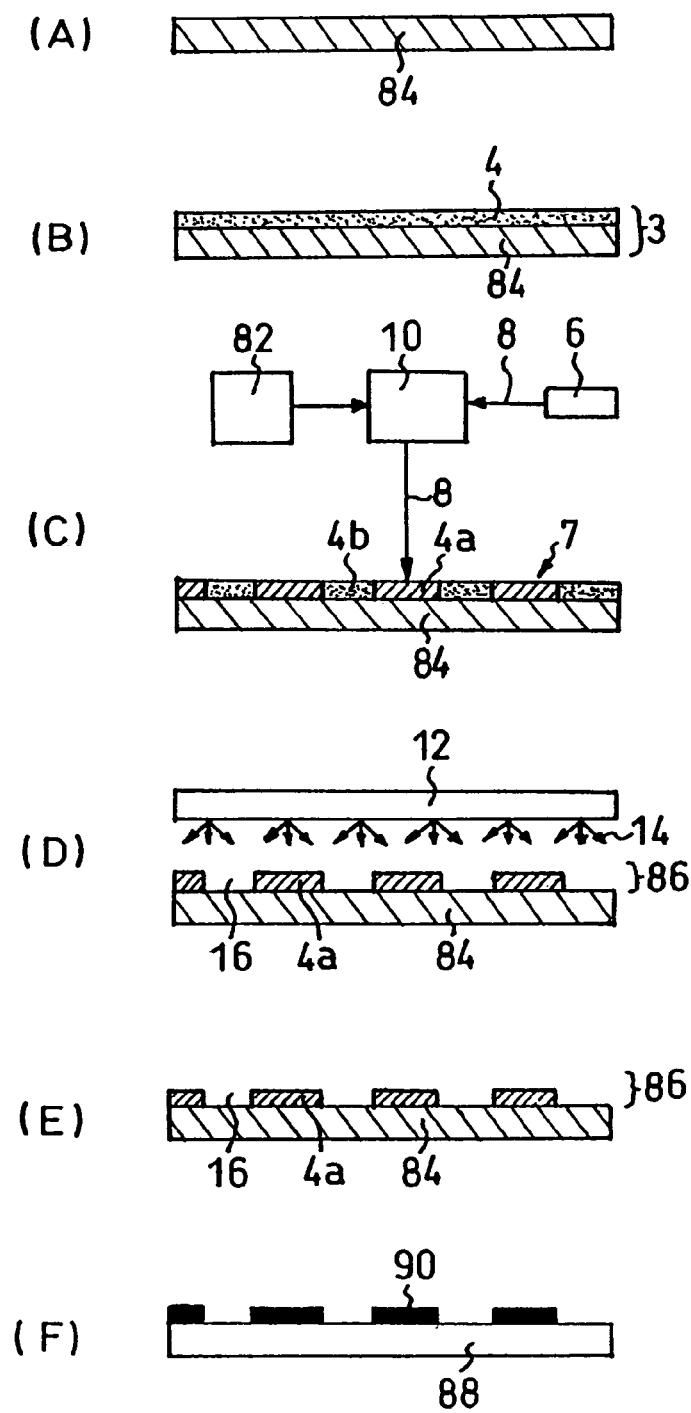
FIG. 7 is a manufacturing process diagram of forming of an image on a plate based upon the present invention.

FIG. 7 shows an example of a manufacturing process diagram of forming an image on a plate surface based upon the present invention. In the process of (A), the plate 84 is shown, it is available that the plate is ceramic board (substrate) having heat resistance or the plastic sheet which does not have heat resistance.

Photosensitive paste is prepared by mixing of photoresist and colorant materials. The colorant materials are made from colorant powder, and there are many kind of colorant materials which show color without or with sintering. The colorant materials give photoresist colors in the case that it is not sintered, and after sintering, the photoresist is removed and only residual colorant material forms. There are contained the cases that a color of colorant materials is changed by sintering or not changed by sintering.

In the process of (B), the photosensitive paste layer 4 is formed by applying the photosensitive paste to the surface of plate 84, and unexposed substrate 3 is completed. In the process of (C), image pattern data which is saved in the image storage facility 82 are output to the laser plotting device 10, and the laser beam 8 emitted from the laser light source 6 is converted to on-off signals. The on-off beam can be called a dot beam, the on-off beam scans on the surface of photosensitive paste layer 4, so that the image is formed with dot patterns. This is to say, the plotting area 7 is formed with the condition which consists of the mixture of exposed area 4a and unexposed area 4b.

In the process of (D), the photosensitive paste layer 4 is developed by spraying of developing solution 14 by the developing device 12 to the photosensitive paste layer 4. As a result, unexposed area 4b is removed and the area 4b becomes removed area 16, and then the unsintered image pattern 86 is formed from exposed area 4a which finally remains.

In the process of (E), the plate 84 which forms unsintered image pattern 86 is shown. The image is formed by colors of colorant materials which is confined inside of photoresist, because photoresist is transparent. The unsintered image pattern 86 becomes a completion picture without sintering, if the plate 84 is denatured by sintering such as plastic plate.

In the process of (F), unsintered image pattern 86 is sintered, and image pattern 90 is formed. Photoresist ingredient is removed, and finally, only colorant materials are clung on the surface of the plate 84 to form the image pattern 90 by sintering. It depends on colorant material that the color is changed by sintering or the color is held even if it is sintered.

The plate 84 becomes sintered plate 88 by means of sintering. In the case that the plate 84 is said greensheet that is denatured to ceramic, sintered plate 88 becomes ceramic board. On the other hand, depending on sintering temperature, in the case that the plate 84 is a ceramic board or a metal plate, the plate 84 is not denatured by means of sintering. Therefore, in this case, sintered material of plate 88 is same as said plate 84.

Figure 8:
FIG. 8 is an image diagram showing an example of unsintered image pattern formed on a plate based upon the present invention.

FIG. 8 shows an example of unsintered image pattern formed on a plate based on the present invention. Unsintered image pattern at an unsinmtering stage is a completion image, because the plate is a thick plastic film and the plate is denatured by sintering. This plate is plane plate, and can be provide as souvenir, craftworks and memento.

The unsintered image pattern is formed through the process of scanning a Japanese traditional painting (image document 70) with scanner 72, and photosensitive paste layer is scanned to expose with laser beam (on-off beam) of the image pattern data, and then the unsintered image pattern is formed by developing. Therefore, the picture is formed by a colorant material which is sealed in the remained photoresist. The image is formed with dot pattern, and the size of the dot is approximately equal to the cross sectional diameter of the laser beam, and it is possible that fine image is formed by minimization of the cross sectional diameter of the laser beam.

Figure 9:
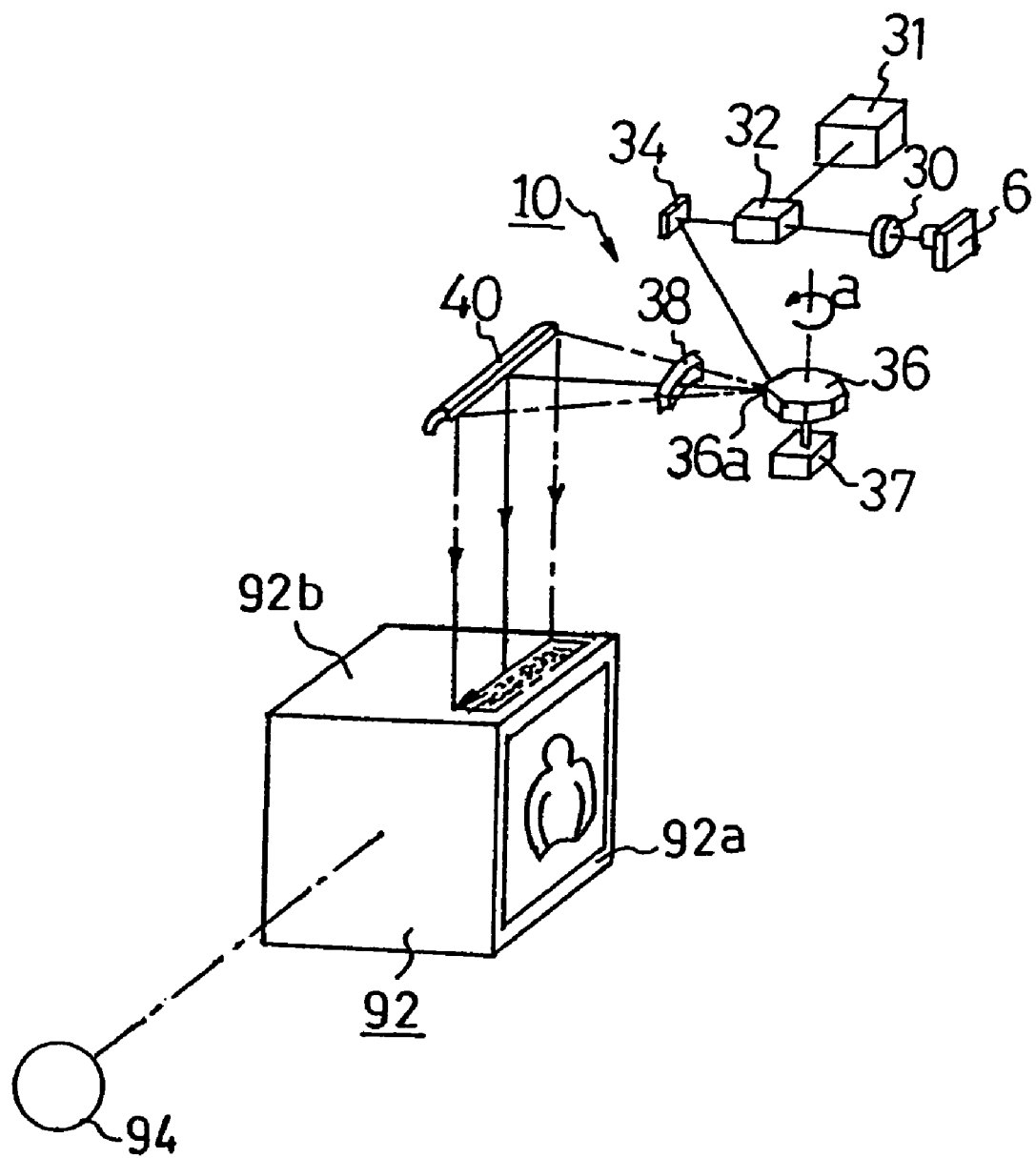
FIG. 9 is a device layout diagram explaining a formation method of an image on the object surface based upon the present invention.
Figure 10:
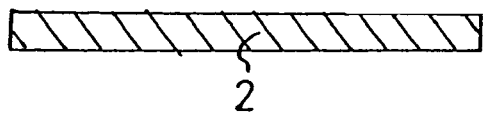
FIG. 10 is a manufacturing process diagram of conventional circuit substrate by using of a ceramic substrate.
Figure 10:
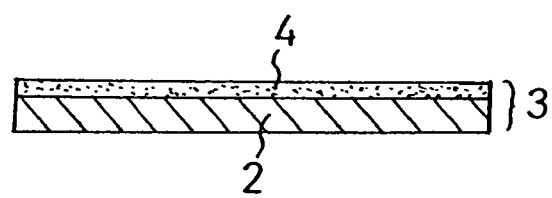
Figure 10:
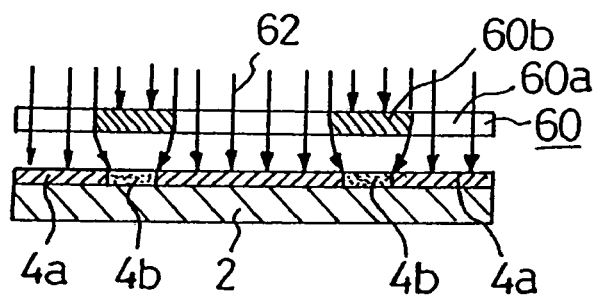
Figure 10:
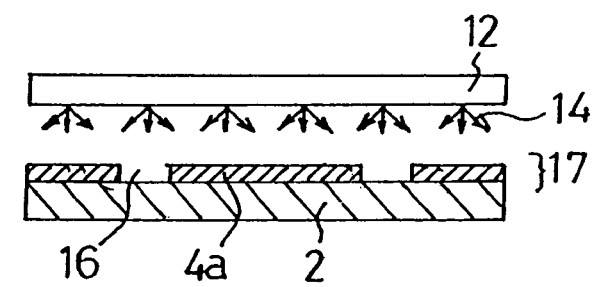
Figure 10:
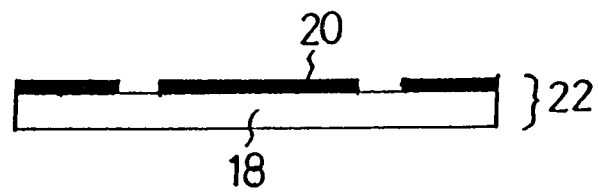

FIG. 9 is a device layout diagram explains a formation method of an image on an object surface based on the present invention. The object 92 is a polyhedron, and images are formed on the each surface of polyhedron 92a, 92b and so on. As an example of a polyhedron, there is a craftwork of a polyhedron type and so on. The object attitude control device 94 is arranged to place the each surface of 92a, 92b etc. of the object 92 at optimum position to the laser plotting device 10.

Since the constitution of the laser plotting device 10 is same as FIG. 2, the explanation is omitted. There is an image of person on the surface 92a. Next, a procedure of forming image on the surface 92b is explained. The surface 92b of the object 92 is moved to a plotting position by driving the object attitude control device 94.

When the surface 92b is placed at the plotting position, arbitrary image is formed on the photosensitive paste layer which is layered on the surface 92b by exposure. The image is formed on each surface of the object 92 intermittently by interlocking the object attitude control device 94 with the laser plotting device 10.

When plotting process is finished, said each surface of the object 92 are developed. There are spray process and dipping process as developing method, where the dipping process is effective because the object 92 is a polyhedron and each surface can be developed simultaneously.

In addition, as other embodiment, there is the case that exterior surface of the object 92 is composed of one or more curved surfaces. As an example of such curved surface body, there are pot-shape ceramic or craftworks. There are some methods to form image on curved surfaces. In the first method, shape of exposure mirror 40 is formed similar to a curved surface of object 92, and exposure mirror 40 is arranged to face the curved surface of the object with constant distance. By using of the similar form, an exposed image with few distortions can be formed on the curved surface.

In the second method, the opposing distance is kept at constant between said exposure mirror 40 and the curved surface under the control of movement of the exposure mirror 40 which has short axis against to the curved surface. In addition, the third method, the exposure mirror 40 is fixed, and the object 92 is moved by the object attitude control device 94 during exposing process, so as that the opposing distance is kept at constant between exposure mirror 40 and the curved surface. Of course, needless to say, it is available to form images with very small distortions by well-known method aside from said methods.

As described above, the present invention is not only limited to give a method to form a circuit pattern on circuit substrate and multilayer circuit substrate but also to copy a various kind of picture such as photograph, picture documents or photogenic subject on surface of various arbitrary objects.

As described above, needless to say, the present invention is not limited to the embodiments described above, and various modifications and design alterations which deviate from the technical spirit of the present invention are included in the technical scope of the invention.

INDUSTRIAL APPLICABILITY

According to the first form of the present invention, it can be contributed to the miniaturization and densification of an electronic device because the production method of circuit substrate of which circuit pattern consists of circuit materials is presented, wherein said method consists of the steps of forming photosensitive paste by mixing photoresist and circuit materials, forming photosensitive paste layer by applying said photosensitive paste to a surface of a substrate, and plotting images consisting of exposed and unexposed area on said layer by laser beam: and then the highly fine circuit pattern with extremely high density can be formed by scanning a laser beam minimized the cross sectional area. Furthermore, the time manufacturing the circuit can be largely shortened than a case to use a conventional photomask, because a laser can plot an arbitrary circuit pattern directly with computer, and then work to make a plate and a positive for photomask can be omitted. In addition, since the circuit pattern can be changed by only changing the circuit pattern data, the most preferable production method of the circuit substrate can be provided for a limited production of diversified products in late years.

According to the second form of the present invention, since the sheet-shaped greensheet which is made from ceramic powder and organic binder is used as a substrate, unsintered circuit pattern and greensheet can be sintered simultaneously, and besides, it can be possible to provide cheaply that substrate having heat-resist can be used at a high temperature location such as high heat position of engine system etc., because ceramic board can be formed by sintering the greensheet. In addition, since internal circuit is protected by ceramic, it can be provided that the substrate can endure in bad working environment such as high humidity, vibration and mine dust etc. for long time.

According to the third form of the present invention, effective production method of a super microcircuit of super high density required in recent years can be provided, because the substrate having highly fine and high density circuit pattern can be formed on the substrate, besides, multilayer circuit substrate of super high density and ultra small can be provided by piling a desired number of substrate.

According to the fourth form of the present invention, since the substrate consists of the greensheet which is made from ceramic powder and organic binder, photosensitive paste layer and greensheet can be sintered simultaneously, besides, since ceramic substrate can be formed by sintering the greensheet, super small and heat resistance can be given to multilayer circuit substrate with super high density. In addition, since internal circuit is protected by ceramic, it can be provided that the multilayer substrate can endure in bad working environment such as high humidity, vibration and mine dust etc. for long time.

According to the fifth form of the present invention, since a base hole is bored on said greensheet, fine laser beam plotting can be performed by relation of the position with the base hole, besides, the pile of the multilayer substrate can be formed finely by only aligning the base holes on the greensheet, and fine construction of solid circuit can be done with ease.

According to the sixth form of the present invention, minute circuit pattern can be plotted on the photosensitive paste layer at high speed, because on-off control of laser beam is realized by storing the circuit pattern data to computer, and the computer control is based on the circuit pattern data. Besides, the most preferable production method of the circuit substrate can be provided for limited production of diversified products, because arbitrary circuit pattern can be formed by only a change of circuit pattern data. Of course, it is natural that the method is applied to a few item large production.

According to the seventh form of the present invention, a substrate having arbitrary circuit pattern can be produced with ease, because a laser beam emitted continuously can be easily converted to an on-off laser beam by an electronic circuit with the waveform shaping unit by only inputting circuit pattern data to the waveform shaping unit, so that contribute to the reduction of circuit substrate cost.

According to the eighth form of the present invention, arbitrary unsintered image pattern can be formed by the following steps of mixing photoresist and colorant to form a photosensitive paste, applying said photosensitive paste to a surface of an object to form a photosensitive layer, plotting images on said photosensitive layer by laser beam and developing said photosensitive layer. Therefore, the image pattern which is highly fine can be formed on the arbitrary object surface, besides, arbitrary color image can be formed easily by changing color of colorant, too.

According to the ninth form of the present invention, in the case that an object is a plane body or polyhedron, an arbitrary image can be formed on the predetermined surface or the entire surface of the object, because unsintered image pattern is formed on the each plane which is going to form pattern. For example, a portrait can be formed on the plate and so on, then novel and unique imaging method on the plane can be offered.

According to the tenth form of the present invention, an unsintered image pattern can be formed on an arbitrary curved surface in the case of an curved object which consists of one or more curved plane surface. For example, the image can be formed on surface of craftworks such as pots etc., then a novel and unique imaging method on curved surface can be offered.

According to the eleventh form of the present invention, image pattern can be formed on an object surface with merely colorant materials, because photoresist is burnt and removed by sintering the unsintered image pattern. Arbitrary colorization is realized by change of colorant materials. In addition, in the case that a color of colorant changes by sintering, an art-related imaging method can be provided like ceramic art.

According to the twelfth form of the present invention, a formation of an image can be changed by merely change of image pattern data with ease, because a laser beam is converted to on-off beam by computer signal based on the image pattern data which is stored to the computer. Therefore, an preferable plotting method can be provided for a limited production of diversified products.

What is claimed is:

1. A method for manufacturing a circuit substrate comprising the steps of:
    mixing a photoresist and a circuit material to form a photosensitive paste, applying said photosensitive paste to a surface of a substrate to form a photosensitive paste layer,
    converging a laser beam emitted from a laser light source to focus a cross section of said laser beam to a dot size of dot pattern composing a circuit pattern, injecting said laser beam into a waveform shaping unit to convert said laser beam to a on-off beam corresponding to said dot pattern by computer signals, reflecting said on-off beam by a surface of a rotating polygon mirror, scanning continuously and repetitiously said on-off beam on a plotted area consisting of exposed and unexposed areas,
    developing said photosensitive paste layer to form an unsintered circuit pattern by removing said exposed area or said unexposed area, and
    sintering said unsintered circuit pattern to form a circuit pattern composed of said circuit material.

2. A method for manufacturing multilayer circuit substrate comprises the steps of:
    mixing a photoresist and a circuit material to form a photosensitive paste,
    applying said photosensitive paste to a surface of a substrate to form a photosensitive paste layer,
    converging a laser beam emitted from a laser light source to focus a cross section of said laser beam to a dot size of dot pattern composing a circuit pattern, injecting said laser beam into a waveform shaping unit to covert said laser beam to an on-off beam corresponding to said dot pattern by computer signals, reflecting said on-off beam by a surface of a rotating polygon mirror, scanning continuously and repetitiously said on-off beam on a plotted area consisting of exposed and unexposed areas,
    developing said photosensitive paste layer to form an unsintered circuit pattern by removing said exposed area or said unexposed area,
    piling up a plurality of substrates formed said unsintered circuit pattern to form an unsintered multilayer circuit substrate, and
    sintering said unsintered multilayer circuit patterns through sintering said unsintered multilayer circuit substrate to form a circuit pattern composed of said circuit material.

3. The method according to claim 2, wherein one or more base holes are formed as located at outside of said plotted area on said substrate,
    said plotted area is formed on said photosensitive paste layer with a predetermined location for said hole, and
    said unsintered multilayer circuit substrate is formed by piling up a plurality of substrates in a state that all base holes are adjusted in a line up and down.

4. A method for forming an image on an object surface comprising the steps of:
    mixing a photoresist and a colorant to form a photosensitive paste,
    applying said photosensitive paste to a surface of an object to form a photosensitive paste layer,
    converging a laser beam emitted from a laser light source to focus a cross section of said laser beam to a dot size of dot pattern composing an image pattern, injecting said laser beam into a waveform shaping unit to convert said laser beam to an on-off beam corresponding to said dot pattern by computer signals, reflecting said on-off beam by a surface of a rotating polygon mirror, scanning continuously and repetitiously said on-off beam on a plotted area consisting of exposed and unexposed areas, and
    developing said photosensitive paste layer to form an unsintered image pattern by removing said exposed area or said unexposed area.

* * * * *